(12) United States Patent
Huo et al.

(10) Patent No.: US 12,183,527 B2
(45) Date of Patent: Dec. 31, 2024

(54) DRIVE CIRCUIT

(71) Applicant: CONTEMPORARY AMPEREX TECHNOLOGY (HONG KONG) LIMITED, Hong Kong (CN)

(72) Inventors: Jirong Huo, Ningde (CN); Yanhui Fu, Ningde (CN); Le Chu, Ningde (CN); Changjian Liu, Ningde (CN)

(73) Assignee: Contemporary Amperex Technology (Hong Kong) Limied, Ningde (CN)

( * ) Notice: Subject to any disclaimer, the term of this patent is extended or adjusted under 35 U.S.C. 154(b) by 263 days.

(21) Appl. No.: 17/740,714

(22) Filed: May 10, 2022

(65) Prior Publication Data

US 2022/0270838 A1 Aug. 25, 2022

Related U.S. Application Data

(63) Continuation of application No. PCT/CN2021/079606, filed on Mar. 8, 2021.

(30) Foreign Application Priority Data

May 29, 2020 (CN) .......................... 202010479364.8

(51) Int. Cl.
*H03K 17/00* (2006.01)
*H01H 47/18* (2006.01)
(Continued)

(52) U.S. Cl.
CPC ........... *H01H 47/18* (2013.01); *H03K 17/284* (2013.01); *H03K 17/687* (2013.01)

(58) Field of Classification Search
CPC .... H03K 17/284; H01H 47/002; H01H 47/18; B60L 3/0023
See application file for complete search history.

(56) References Cited

U.S. PATENT DOCUMENTS 10,814,726 B2 * 10/2020 Zeng .......................... G06F 1/30
2011/0193588 A1 * 8/2011 Jain .......................... H03K 5/135
326/98

(Continued)

FOREIGN PATENT DOCUMENTS

CN 104410252 A 3/2015
CN 205149545 U 4/2016
(Continued)

OTHER PUBLICATIONS

China National Intellectual Property Administration, Office Action dated Jun. 14, 2023, in Application No. 202010479364.8, 16 pages.

(Continued)

*Primary Examiner* — Tuan T Lam
(74) *Attorney, Agent, or Firm* — Haverstock & Owens, A Law Corporation

(57) ABSTRACT

Embodiments of this application relate to the field of electricity, and disclose a drive circuit. In some embodiments of this application, the drive circuit includes a low-side driver module and a delay module, the delay module is configured to output a delay signal of preset duration to the low-side driver module in a case that a control module is being reset; and the low-side driver module is configured to: according to on the delay signal of preset duration, maintain a first state within the preset duration, the first state being the same as a second state; where the second state is a working state of the low-side driver module before the control module is reset, and the second state includes being on or off. The embodiments can help avoid safety hazards caused by unexpected disconnection of a drive signal of the control module.

10 Claims, 7 Drawing Sheets

(51) Int. Cl.
*H03K 17/284* (2006.01)
*H03K 17/687* (2006.01)

(56) References Cited

U.S. PATENT DOCUMENTS

| | | |
|---|---|---|
| 2015/0055271 A1 | 2/2015 | Chen et al. |
| 2019/0363706 A1 | 11/2019 | Shinomiya et al. |
| 2020/0044585 A1 | 2/2020 | Hatakeyama |

FOREIGN PATENT DOCUMENTS

| | | |
|---|---|---|
| CN | 105609371 A | 5/2016 |
| CN | 108473059 A | 8/2018 |
| CN | 209232673 U | 8/2019 |
| CN | 110262297 A | 9/2019 |
| CN | 209344264 U | 9/2019 |
| CN | 110473742 A | 11/2019 |
| CN | 210062958 U | 2/2020 |
| CN | 110962602 A | 4/2020 |
| EP | 3626507 A1 | 3/2020 |
| IN | 209479429 U | 10/2019 |
| JP | 2010251200 A | 11/2010 |
| WO | 2015196762 A1 | 12/2015 |

OTHER PUBLICATIONS

European Patent Office, European Search Report dated Jul. 12, 2023, in U.S. Appl. No. 21/812,646, 7 pages.

Li Xu et al., "Fault Protection and Reset Method for Fiber Optic Isolated High-power IGBT Drivers", China Academic Journal Electronic Publishing House, Nanjing University Aeronautics and Astronautics, Nanjing 210016, China, Power Electronics vol. 44, No. 11, Nov. 2010, pp. 47-49.

Pires et al., "Protecting Control Panels Against Voltage Sags Using Square-Wave Series Voltages Compensators", 2012 IEEE Industry Applications Society Annual Meeting, Las Vegas, NV, USA, 2012, pp. 1-7.

The International Search Report for the International Application PCT/CN2021/079606, dated Jun. 22, 2021, 8 pages.

\* cited by examiner

DRIVE CIRCUIT

CROSS-REFERENCE TO RELATED APPLICATIONS

This application is a continuation of International Application No. PCT/CN2021/079606 filed on Mar. 8, 2021, which claims the priority to Chinese patent application No. 202010479364.8, filed on May 29, 2020 and entitled "DRIVE CIRCUIT", both of which are incorporated herein by reference in their entireties.

TECHNICAL FIELD

Embodiments of this application relate to the field of electricity, and in particular, to a drive circuit.

BACKGROUND

The automobile industry is witnessing a development tendency that electric vehicles are replacing fossil fuel vehicles. In a high-voltage loop of the electric vehicle, a relay is typically used as a switch for on/off switching. Switching on/off of the relay is controlled by a microcontroller of a battery management system.

However, the inventors have found that there is at least the following problem in some cases: potential unexpected reset of the microcontroller during driving, causing great safety hazards to the vehicle.

SUMMARY

An embodiment of this application provides a drive circuit, where the drive circuit includes a low-side driver module and a delay module, the delay module is configured to output a delay signal of preset duration to the low-side driver module in a case that a control module is being reset; and the low-side driver module is configured to: according to the delay signal of preset duration, maintain a first state within the preset duration, the first state being the same as a second state; where the second state is a working state of the low-side driver module before the control module is reset, and the second state includes being on or off.

Compared with the prior art, in this embodiment of this application, when the control module is being reset, the delay module can output a delay signal to the low-side driver module, so that the low-side driver module maintains a state before the control module is reset, thereby avoiding safety hazards caused by a state change of the low-side driver module due to the reset of the control module.

In an embodiment, the delay module includes a delay unit and a first pull-up unit; a first controlled terminal of the delay unit is connected to both the first pull-up unit and a first output terminal of the control module, a second controlled terminal of the delay unit is connected to a second output terminal of the control module, and an output terminal of the delay unit is connected to a control terminal of the low-side driver module; and the delay unit is configured to: when an electrical signal of a first level is detected at the first controlled terminal and an edge signal is detected at the second controlled terminal, output a delay signal of a second level; and when an electrical signal of a third level is detected at the first controlled terminal, output a delay signal of a fourth level, where the fourth level is a reverse level of the second level, the third level is a reverse level of the first level, and the low-side driver module maintains an on state when receiving an electrical signal of the second level and switched off when receiving an electrical signal of the fourth level.

In this embodiment, the level of the delay signal is the same as the level of the drive signal output by the control module before the reset.

In an embodiment, in a case that the edge signal is a rising edge signal, the delay module further includes a second pull-up unit, and the second pull-up unit is connected to the second controlled terminal of the delay unit.

Port A is changed from a low level to a high level because the output of the control module is in a high-impedance state and there is a second pull-up unit. That is, a rising edge appears.

In an embodiment, the delay unit includes N cascaded delay components; and first input terminals of all the delay components are mutually connected, where a joint serves as the first controlled terminal of the delay unit, a second input terminal of a $1^{st}$ delay component is connected to the second controlled terminal of the delay unit, a second input terminal of an $(i+1)^{th}$ delay component is connected to an output terminal of an $i^{th}$ delay component, and an output terminal of an $N^{th}$ delay component serves as the output terminal of the delay unit, where $1 \leq i < N$, and N is an integer greater than 1.

In this embodiment, the N cascaded delay components can help prolong the delay time.

In an embodiment, N is equal to 2.

In an embodiment, the delay component is a monostable flip-flop.

In an embodiment, a drive signal includes a drive signal of the second level and a drive signal of the fourth level; and the control module is configured to: after detecting a switch-on signal, output the drive signal of the second level to the low-side driver module, output a control signal of the first level or the third level to the first controlled terminal of the delay module, and output a control signal of a fifth level or a first Pulse Width Modulation (PWM) control signal to the second controlled terminal of the delay module; and after detecting a switch-off signal, output the drive signal of the fourth level to the low-side driver module, and output a control signal of the third level to the first controlled terminal and the second controlled terminal of the delay module, where a period of the first pulse width modulation PWM control signal is less than the preset duration; and when the edge signal is a rising edge signal, the fifth level is a low level, or when the edge signal is a falling edge signal, the fifth level is a high level.

Because the control module outputs the drive signal of the fourth level to the low-side driver module and the delay module outputs the delay signal of the fourth level to the low-side driver module, the low-side driver module is off. When the control module is being reset, the first controlled terminal of the delay unit is pulled up to the first level, and the second controlled terminal of the delay unit cannot detect a specific edge signal, and therefore, the delay module outputs the delay signal of the fourth level to the low-side driver module, so that the low-side driver module maintains an off state.

In an embodiment, the drive circuit is configured to drive a load, and the load is grounded through the low-side driver module; and the low-side driver module includes a first low-side driver unit and a second low-side driver unit, where a first terminal of the first low-side driver unit and a first terminal of the second low-side driver unit are both connected to the load, a second terminal of the first low-side driver unit and a second terminal of the second low-side driver unit are grounded, the control module is connected to a control terminal of the first low-side driver unit, and the delay module is connected to a control terminal of the second low-side driver unit.

In an embodiment, the control module is configured to: after detecting a switch-on signal, output the drive signal of the second level or a second pulse width modulation PWM control signal to the first low-side driver unit, output a control signal of the first level or the third level to the first controlled terminal of the delay module, and output a control signal of a fifth level or a third pulse width modulation PWM control signal to the second controlled terminal of the delay module; and after detecting a switch-off signal, output the drive signal of the fourth level to the first low-side driver unit, and output a control signal of the third level to the first controlled terminal and the second controlled terminal of the delay module, where a period of the third pulse width modulation PWM control signal is less than the preset duration; and when the edge signal is a rising edge signal, the fifth level is a low level, or when the edge signal is a falling edge signal, the fifth level is a high level.

In this embodiment, controlling the first low-side driver unit with the pulse width modulation PWM drive signal can adjust the switch-on time of the low-side driver module by changing a duty ratio of the PWM drive signal, thereby adjusting a current of the load terminal.

In an embodiment, the drive circuit further includes a first anti-reverse module and a second anti-reverse module, the delay module is connected to the control terminal of the low-side driver module through the first anti-reverse module, and the control module is connected to the control terminal of the low-side driver module through the second anti-reverse module.

In this embodiment, the drive signal of the control terminal can compete with the output signal of the delay module for power supply, and the low-side driver unit can be connected when either signal meets the requirement.

In an embodiment, the drive circuit is configured to drive a load, and the load is grounded through the low-side driver module; and the control module is further configured to: at the end of the reset, output the drive signal based on a recheck signal input by a recheck module or load state data stored in a storage module, to control the low-side driver module, where an input terminal of the recheck module is connected to a joint between the low-side driver module and the load or connected to the control terminal of the low-side driver module, and an output terminal of the recheck module is connected to the control module.

In this embodiment, at the end of the reset (work resumed), the control module can output a control signal of a level the same as a level of a drive signal output before the reset.

In an embodiment, the recheck module includes a voltage divider sub-module and a filter sub-module, a first terminal of the voltage divider sub-module serves as the input terminal of the recheck module, a second terminal of the voltage divider sub-module is connected to a first terminal of the filter sub-module, and a second terminal of the filter sub-module serves as the output terminal of the recheck module.

An embodiment of this application further provides a processing method for a drive circuit, where the drive circuit includes a low-side driver module and a delay module; and the processing method includes:

outputting, by the delay module, a delay signal of preset duration to the low-side driver module in a case that a control module is being reset; and according to the delay signal of preset duration, maintaining, by the low-side driver module, a first state within the preset duration, where the first state is the same as a second state;

where the second state is a working state of the low-side driver module before the control module is reset, and the second state includes being on or off.

BRIEF DESCRIPTION OF DRAWINGS

One or more embodiments are used as examples for description by using figures in corresponding accompanying drawings. These example descriptions impose no limitation on the embodiments. Elements with a same reference sign in the accompanying drawings represent similar elements. Unless otherwise stated, the figures in the accompanying drawings impose no limitation on a scale.

To describe the technical solutions in the embodiments of this application or in the prior art more clearly, the following briefly describes the accompanying drawings required for describing the embodiments or the prior art. Apparently, the accompanying drawings in the following description show merely some of the embodiments of this application, and a person of ordinary skill in the art may still derive other drawings from these accompanying drawings without creative efforts.

DESCRIPTION OF EMBODIMENTS

To make the objectives, technical solutions, and advantages of the embodiments of this application clearer, the following describes the embodiments of this application in detail with reference to the accompanying drawings. However, a person of ordinary skill in the art can understand that many technical details are put forward in the embodiments of this application to make a reader better understand this application. However, even without the technical details and various changes and modifications on a basis of the following embodiments, the technical solution claimed in this application can be implemented.

In the descriptions of this application, it should be noted that, unless otherwise stated, "plurality" means two or more; and the orientations or positional relationships indicated by the terms "upper", "lower", "left", "right", "inside", "outside", and the like are merely intended to facilitate the descriptions of this application and simplify the descriptions other than indicate or imply that the apparatuses or components must have specific orientations, or be constructed and operated for a specific orientation, and therefore shall not be construed as a limitation to this application. In addition, the terms "first", "second", and "third" are merely intended for a purpose of description, and shall not be understood as an indication or implication of relative importance. "Vertical" means being within an allowable range of an error other than being strictly vertical. "Parallel" means being within an allowable range of an error other than being strictly parallel.

The orientations used in the following descriptions are all directions shown in the figure, and are not intended to limit the specific structure in the application. In the descriptions of this application, it should be further noted that unless otherwise specified and defined explicitly, the terms "installment", "link", and "connection" should be understood in their general senses. For example, the terms may be a fixed connection, a detachable connection, or an integrated connection, or may be a direct connection, or an indirect connection through an intermediate medium. A person of ordinary skills in the art can understand specific meanings of these terms in this application based on specific situations.

Figure 1:
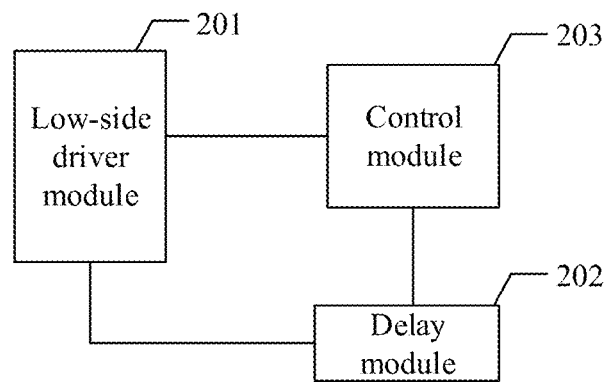
FIG. 1 is a schematic structural diagram of a drive circuit according to a first embodiment in the embodiments of this application.

A first embodiment in the embodiments of this application relates to a drive circuit. As shown in FIG. 1, the drive circuit includes a low-side driver module 201 and a delay module 202. The delay module 202 is configured to output a delay signal of preset duration to the low-side driver module 201 in a case that a control module 203 is being reset. The low-side driver module 201 is configured to: according to the delay signal of preset duration, maintain a first state within the preset duration, the first state being the same as a second state, where the second state is a working state of the low-side driver module 201 before the control module 203 is reset, and the second state includes being on or off.

In this embodiment, the control module 203 cannot output a control signal during the reset. When the control module 203 is being reset, the delay module 202 outputs a delay signal of a level the same as that for a drive signal output by the control module 203 before the reset, so that in a case that the control module 203 is being reset, the low-side driver module 201 can maintain a state before the reset, to avoid a safety problem caused by an abrupt state change of the low-side driver module 201 when the control module 203 is being reset. When the control module 203 is being reset, a delay function of the entire circuit is implemented through a separate delay module 202, thereby simplifying drive logic of the control module 203 and a circuit design.

A second embodiment in the embodiments of this application relates to a drive circuit. This embodiment is approximately the same as the first embodiment, with a main difference as follows: An example in which the drive circuit is configured to drive a load is used to describe a connection manner of the drive circuit and the load, and a function of the drive circuit.

Figure 2:
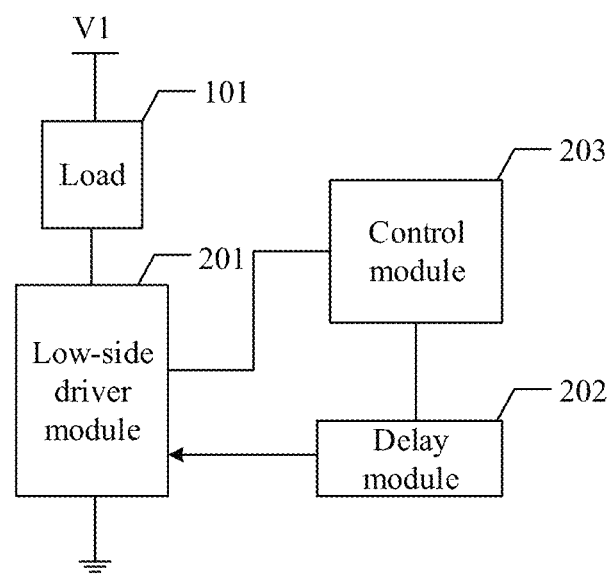
FIG. 2 is a schematic structural diagram of a drive circuit according to a second embodiment in the embodiments of this application.

Specifically, as shown in FIG. 2, the drive circuit is configured to drive a load 101, the load 101 is grounded through a low-side driver module 201. The delay module 202 is configured to: output a delay signal of preset duration to the low-side driver module 201 in a case that a control module 203 is being reset. The preset duration is set based on reset duration of the control module 203. For example, the preset duration is greater than maximum reset duration of the control module 203. For example, if the reset duration of the control module 203 ranges approximately from 1 second to 3 seconds, the preset duration is greater than 3 seconds. The low-side driver module 201 is configured to: according to the delay signal of preset duration, maintain a first state within the preset duration, where the first state is the same as a second state. The second state is a working state of the low-side driver module 201 before the control module 203 is reset, and the second state includes being on or off. When the control module 203 is working properly, the low-side driver module 201 is configured to perform switching-on or switching-off based on the drive signal from the control module 203.

In this embodiment, when the control module 203 is being reset, the delay module 202 outputs a delay signal of a level the same as that of a drive signal output by the control module 203 before the reset, so that in a case that the control module 203 is being reset, the low-side driver module 201 can maintain a state before the reset, to avoid a safety problem caused by an abrupt state change of the low-side driver module 201 when the control module 203 is being reset. The control module 203 can output the drive signal to control the low-side driver module 201 to switch on or off. When the control module 203 is being reset, a delay function of the entire circuit is implemented through a separate delay module 202, thereby simplifying drive logic of the control module 203 and a circuit design.

In an embodiment, a first terminal of the load 101 is connected to a drive power supply V1, and a second terminal of the load 101 is grounded through the low-side driver module 201.

It should be noted that a person skilled in the art can understand that the drive power supply is configured to supply power to the load 101. A type of the drive power supply is determined based on an application scenario. For example, when this embodiment is applied to an electric vehicle, the drive power source is usually a vehicle lead-acid battery, and the ground is a vehicle low-voltage ground. The type of the drive power supply is not limited in this embodiment.

It should be noted that a person skilled in the art can understand that the load 101 in this embodiment may be a device such as a relay or a contactor, or may be another device such as a pump (PUMP) or a valve. Details are not listed herein.

An example in which the load 101 is the relay and the control module 203 is a microcontroller in a battery management system of a vehicle is used below to describe the drive circuit mentioned in this embodiment. In the prior, in a high-voltage loop of the electric vehicle, a relay is usually used as a switch for connection or disconnection. Switching on and off of the relay are usually controlled by the microcontroller of the battery management system. However, the microcontroller may be reset during driving, and the reset duration is relatively short. When the microcontroller is being reset, no drive signal can be output. In this case, the relay abruptly switches off and the vehicle abruptly stops, causing a great safety hazard. In addition, disconnecting the relay with the load has great impact on service life of the relay. In this embodiment, a delay module 202 is added between the low-side driver module 201 and the microcontroller. When the relay is on, if the microcontroller is being reset, the delay signal output by the delay module 202 to the low-side driver module 201 can keep the relay in an on state, so that the relay is not accidentally switched off. Likewise, in a case that the relay is in an off state, if the microcontroller is being reset, the delay signal output by the delay module 202 to the low-side driver module 201 can keep the relay in an off state, so that the relay is not accidentally switched on.

It should be noted that a person skilled in the art can understand that in this embodiment, the vehicle field is used as an example to describe the drive circuit. In practical applications, the drive circuit may also be applied to another field. The application field of the drive circuit is not limited in this embodiment.

In an embodiment, the delay module 202 includes a delay unit and a first pull-up unit; a first controlled terminal of the delay unit is connected to both the first pull-up unit and a first output terminal of the control module 203, a second controlled terminal of the delay unit is connected to a second output terminal of the control module 203, and an output terminal of the delay unit is connected to a control terminal of the low-side driver module 201. The first pull-up unit pulls up an input signal of the first controlled terminal of the delay unit to a high level signal. The delay unit is configured to: when an electrical signal of a first level is detected at the first controlled terminal and an edge signal is detected at the second controlled terminal, output a delay signal of a second level to a low-side driver module 201, to control the low-side driver module 201 to switch on; when an electrical signal of a first level is detected at the first controlled terminal and no edge signal is detected at the second controlled terminal, output a delay signal of a fourth level to a low-side driver module 201, to control the low-side driver module 201 to switch off; and when an electrical signal of a third level is detected at the first controlled terminal, output a delay signal of a fourth level to a low-side driver module 201, to control the low-side driver module 201 to switch off. The fourth level is a reverse level of the second level, the third level is a reverse level of the first level, and the low-side driver module 201 maintains an on state when receiving an electrical signal of the second level and switched off when receiving an electrical signal of the fourth level.

It should be noted that the edge signal may be a rising edge signal or a falling edge signal. A person skilled in the art can determine a circuit form of the delay unit based on working logic of the delay unit.

In an embodiment, in a case that the edge signal is a rising edge signal, the delay module 202 further includes a second pull-up unit, and the second pull-up unit is connected to the second controlled terminal of the delay unit.

In an embodiment, the first level and the second level are co-directional levels, the third level and the fourth level are co-directional levels, and the first level and the third level are reverse levels. It is assumed that the first level and the second level are high levels, the third level and the fourth level are low levels, a high-level delay signal output by the delay unit when a high-level electrical signal is detected at the first controlled terminal and an edge signal is detected at the second controlled terminal is a pulse signal, that is, a high-level pulse signal. Specifically, input and output level states that can be implemented by the delay unit are shown in Table 1.

TABLE 1

|  | First controlled terminal | Second controlled terminal | Output terminal |
| --- | --- | --- | --- |
| Case 1 | Low level | Any level | Low level |
| Case 2 | High level | Edge signal | High-level pulse |

It should be noted that a person skilled in the art can understand that in practical applications, a delay time (namely, the preset duration) of the delay unit can be set based on a reset time of the control module 203, so that the preset duration is greater than reset duration of the control module 203. A resistance value, a capacitance value, and the like of a corresponding circuit device are selected based on the delay time of the delay unit. A specific circuit form of the delay unit is not limited in this embodiment.

In an embodiment, either of the first pull-up unit and the second pull-up unit includes a pull-up resistor, a first terminal of the pull-up resistor is connected to a signal terminal of a pull-up power supply, and a second terminal of the pull-up resistor serves as an output terminal of the pull-up unit.

It should be noted that a person skilled in the art can understand that in practical applications, the first pull-up unit and the second pull-up unit may also use another circuit structure. This embodiment is only used as an example for illustration, and imposes no limitation on specific circuits of the first pull-up unit and the second pull-up unit.

It should be noted that a person skilled in the art can understand that in practical applications, a structure of the first pull-up unit may be the same as or different from a structure of the second pull-up unit. This embodiment is illustrated using an example that they are the same, but imposes no limitation on a circuit structure in actual use.

It should be noted that a person skilled in the art can understand that the signal terminal of the pull-up power supply may be an output terminal of the pull-up power supply, and a voltage output by the pull-up power supply may be the same as a high-level voltage of a signal output by the control module 203. A voltage value of the pull-up power supply is not limited in this embodiment.

The following uses an example in which the edge signal is the falling edge with reference to different forms of drive circuits and protective circuits to illustrate a working principle of the drive circuit.

In a first example, a delay unit includes a delay component. A first input terminal of the delay component is the first controlled terminal of the delay unit, a second input terminal of the delay component serves as the second controlled terminal of the delay unit, and an output terminal of the delay component serves as the output terminal of the delay unit. The delay component is configured to generate a delay signal of a corresponding level based on an electrical signal received by the first input terminal of the delay component and the electrical signal received by the second input terminal of the delay component, to control the low-side driver module 201 to switch on or off. For a level relationship between the electrical signal received by the first input terminal of the delay component, the electrical signal received by the second input terminal of the delay component, and the output delay signal, refer to descriptions in Table 1.

In a first embodiment of the first example, the low-side driver module 201 includes a low-side driver unit. The output terminal of the delay unit is connected to a control terminal of the low-side driver unit. In this embodiment, a drive signal includes a drive signal of a second level and a drive signal of a fourth level; and the control module 203 may be configured to: after detecting a switch-on signal, output the drive signal of the second level to the low-side driver module 201, to control the low-side driver module 201 to switch on; and output a control signal of the first level or the third level to the first controlled terminal of the delay module 202, and output a control signal of a fifth level or a first pulse width modulation (Pulse Width Modulation, PWM) control signal to the second controlled terminal of the delay module 202, to control the delay module 202 to output the electrical signal of the second level or the electrical signal of the fourth level. Because the control module 203 outputs the drive signal of the second level to the low-side driver module 201, the low-side driver module 201 is in an on state regardless of whether the delay module 202 outputs the electrical signal of the second level or the electrical signal of the fourth level. When the control module 203 is being reset, the first controlled terminal of the delay unit is pulled up to the first level, and the second controlled terminal of the delay unit can detect the edge signal, to output a delay signal of the second level to the low-side driver module 201, so that the low-side driver module 201 maintains an on state. After detecting a switch-off signal, the control module 203 outputs the drive signal of the fourth level to the low-side driver module 201, and outputs the control signal of the third level to the first controlled terminal of the delay module 202 and the second controlled terminal of the delay module 202. Because the control module 203 outputs the drive signal of the fourth level to the low-side driver module 201 and the delay module 202 outputs the delay signal of the fourth level to the low-side driver module 201, the low-side driver module 201 is off. When the control module 203 is being reset, the first controlled terminal of the delay unit is pulled up to the first level, and the second controlled terminal of the delay unit cannot detect a specific edge signal, and therefore, the delay module 202 outputs the delay signal of the fourth level to the low-side driver module 201, so that the low-side driver module 201 maintains an off state. A period of the first pulse width modulation PWM control signal is less than the preset duration; and when the edge signal is a rising edge signal, the fifth level is a low level, or when the edge signal is a falling edge signal, the fifth level is a high level.

The following uses an example to describe detection of a switch-on signal and a switch-off signal.

In some embodiments, the switch-on signal is a high-level signal, and the switch-off signal is a low-level signal. In order that a staff member controls the load 101, a control loop may be disposed. The control loop includes a control power supply, a switch (such as a single-pole switch, a push-button switch, or the like), and a resistor that are connected in series in sequence. A current in the resistor is detected through a voltage detection circuit, and a detection result is output to the control module 203. When the switch in the control loop is switched on, the voltage detection circuit detects a voltage value, and then a high-level signal is output to the control module 203. The control module 203 receives the high-level signal, that is, detects a high-level signal, and then controls the load 101 to switch on according to the foregoing logic. When the switch in the control loop is switched off, the voltage detection circuit detects no voltage value, and then a low-level signal is output to the control module 203. The control module 203 receives a low-level signal, that is, detects the low-level signal, and then controls the load 101 to switch off according to the foregoing logic.

It should be noted that a person skilled in the art can understand that in practical applications, the switch-on signal may alternatively be a switch-on command input by a staff member, and the switch-off signal may alternatively be an input switch-off command. For example, the control module 203 is connected to an input device, and the control module 203 detects a command input by the staff member through the input device. After detecting the switch-on command, the control module 203 controls the load 101 to switch on based on the foregoing logic. After detecting the switch-off command, the control module 203 controls the load 101 to switch off based on the foregoing logic. Manners of generating the switch-on signal and the switch-off signal are not limited in this embodiment.

In some embodiments, the first level and the second level are co-directional levels, and the third level and the fourth level are co-directional levels.

In some embodiments, after detecting the switch-on signal, the control module 203 outputs the first level to the first controlled terminal of the delay module 202, to ensure that when the control module 203 is being reset and the edge signal is detected at the second controlled terminal, the delay module 202 outputs a delay signal of the second level, so that a low-side driver module maintains an on state.

Figure 3:
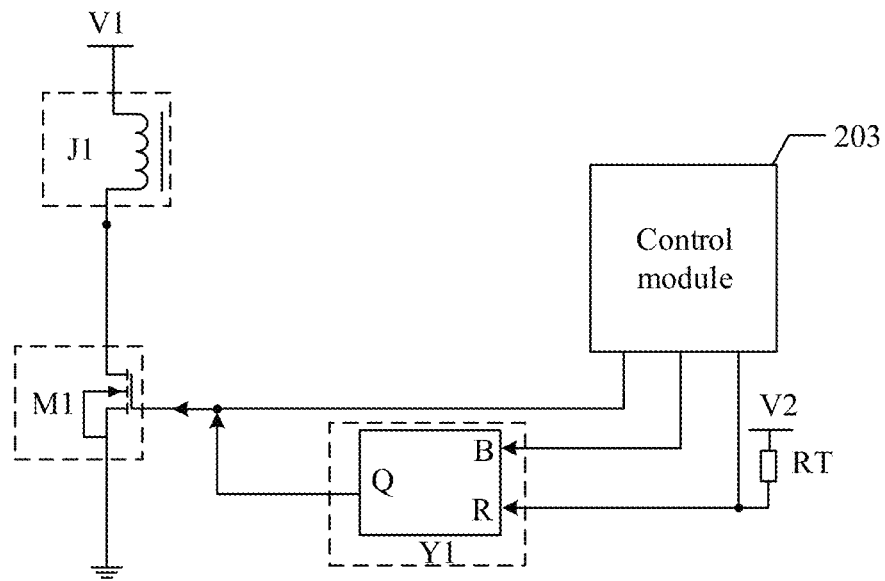
FIG. 3 to FIG. 6 are schematic circuit diagrams of a drive circuit when an edge signal is a falling edge signal according to the second embodiment in the embodiments of this application.

It is assumed that the load 101 is a relay and the low-side driver unit is a type-N transistor, the edge signal is the falling edge signal, the first level and the second level are high levels, and the third level and the fourth level are low levels. FIG. 3 is a schematic circuit diagram of the drive circuit. V1 represents the drive power supply, J1 represents the relay, M1 represents the low-side driver unit, Y1 represents the delay component, R represents the first input terminal of the delay component, B represents the second input terminal of the delay component, Q represents the output terminal of the delay component, V2 represents a first signal terminal of the pull-up power supply, and RT represents a first pull-up resistor. A level of the control signal (referred to as a control signal 1) output by the control module 203 to the first controlled terminal of the delay unit may be set based on a working principle of the delay unit, and the control signal (referred to as a control signal 2) output by the control module 203 to the second controlled terminal of the delay unit may be a constant-level signal (including a low-level signal and a high-level signal) or a pulse width modulation signal.

When the control signal 2 is the constant-level signal, the working principle of the drive circuit is as follows: When receiving a relay switch-on signal, the control module 203 outputs a high-level drive signal to the control terminal of the low-side driver unit, outputs a high-level control signal 2 to the port B of the delay component, and outputs a high-level control signal 1 to the port R of the delay component. In this case, a state of the port Q is a low level, and the low-side driver unit is switched on. When the control module 203 is being reset, output of the control module 203 is in a high-impedance state, the port B of the delay component changes from a high level to a low level, and a falling edge occurs. In addition, because there is the first pull-up unit, the port R remains at a high level, a high-level pulse is output at the port Q, the low-side driver unit maintains an on state, and the relay maintains the original on state. When receiving a relay switch-off signal, the control module 203 outputs a low-level drive signal to the control terminal of the low-side driver unit, outputs a low-level control signal 2 to the port B of the delay component, and outputs a low-level control signal 1 to the port R of the delay component (a low-level control signal 1 may alternatively be first output, and then a low-level drive signal is output to the control terminal of the low-side driver unit). In this case, a state of the port Q is a low level, and the low-side driver unit is switched off. When the relay is off and the control module 203 is being reset, the output of the control module 203 is in a high-impedance state, and the port B of the delay component is still at a low level (no falling edge). Because there is the first pull-up unit, input of the port R changes from the low level to the high level, output of the port Q is still at the low level, the state of the low-side driver unit does not change, and the relay is not accidentally switched on.

It should be noted that a person skilled in the art can understand that, if an interval between the control signal 1 and the drive signal is very short and less than action time of the relay, an output sequence of the control signal 1 and the drive signal may not be limited. If the interval between the control signal 1 and the drive signal is very long and greater than the action time of the relay, in this embodiment, the low-level control signal 1 and control signal 2 are output firstly, and then the low-level drive signal is output.

It is worth mentioning that, the low-level control signal 1 is output before the low-level drive signal is output, thereby preventing the relay from being switched on and then being switched off caused by resetting of the microcontroller when the low-level control signal 1 is not sent after the low-level drive signal has been sent.

When the control signal 2 is the PWM signal, the working principle of the drive circuit is as follows: When receiving a relay switch-on signal, the control module 203 outputs a high-level drive signal to the control terminal of the low-side driver unit, outputs a high-level control signal 1 to the port R of the delay component, and outputs a PWM control signal 2 to the port B of the delay component, so that the low-side driver unit is switched on. Whenever a falling edge occurs in the control signal 2, a high-level pulse is output at the port Q, which may be repeatedly triggered. When the delay time of the delay unit is greater than a PWM period, a high level is continuously output at the port Q. When the control module 203 is being reset, a high level is output at the port Q of the delay module 202. It is assumed that a period of the control signal 2 is t, set delay time is T1, and T1 is greater than t, if a delay start time is between 0.5*t and t, the time to stay at high level is [T1−0.5*t, T1); and if a delay start time is between 0 and 0.5*t, the time to stay at high level is T1. The low-side driver unit maintains an on state within the set delay time, and the relay maintains the original on state. When receiving a relay switch-off signal, the control module 203 outputs a low-level drive signal to the low-side driver unit, outputs a low-level control signal 1 to the port R of the delay component, and outputs a low-level control signal 2 to the port B of the delay component, and the low-side driver unit is switched off. When the control module 203 is being reset, the output of the control module 203 is in a high-impedance state, and the port B of the delay component is still at a low level. Because there is the first pull-up unit, a state of the port R of the delay component changes from a low level to a high level, output of the port Q is still at a low level, the state of the low-side driver unit does not change, and the relay is not accidentally switched on.

In some embodiments, the drive circuit further includes a first anti-reverse module and a second anti-reverse module, the delay module 202 is connected to the control terminal of the low-side driver module 201 through the first anti-reverse module, and the control module 203 is connected to the control terminal of the low-side driver module 201 through the second anti-reverse module.

Figure 4:
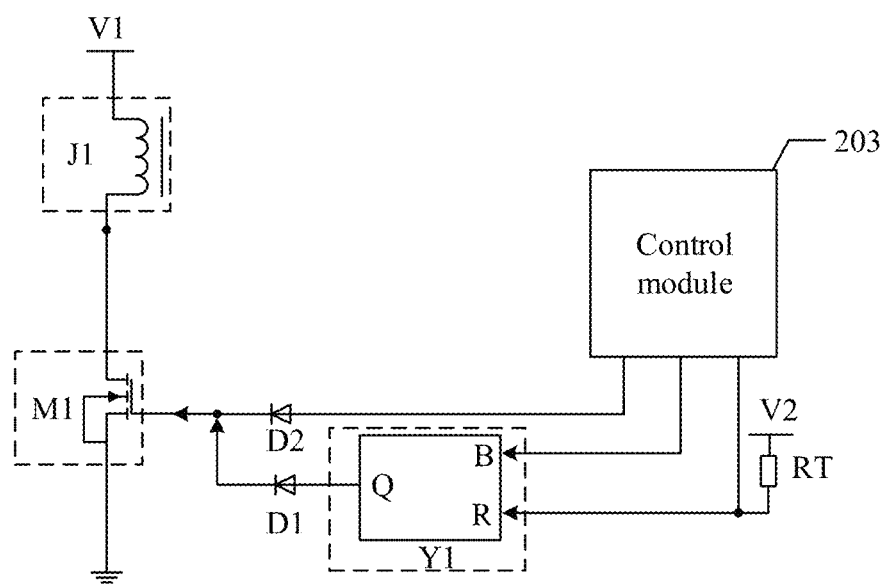

In some embodiments, the first anti-reverse module and the second anti-reverse module are diodes. It is assumed that the load 101 is a relay and the low-side driver unit is a type-N transistor, the first level and the second level are high levels, the third level and the fourth level are low levels, and the edge signal is the falling edge signal. FIG. 4 is a schematic circuit diagram of the drive circuit. V1 represents the drive power supply, J1 represents the relay, M1 represents the low-side driver unit, Y1 represents the delay component, R represents the first input terminal of the delay component, B represents the second input terminal of the delay component, Q represents the output terminal of the delay component, V2 represents a first signal terminal of the pull-up power supply, and RT represents a first pull-up resistor, D1 represents the first anti-reverse module, and D2 represents the second anti-reverse module. The control signal 2 may be a constant-level signal or a pulse width modulation signal.

It is worth mentioning that, the delay module 202 is connected to the control terminal of the low-side driver module 201 through the first anti-reverse module, and the control module 203 is connected to the control terminal of the low-side driver module 201 through the second anti-reverse module, so that the drive signal from the control module 203 and the output signal from the delay module 202 compete for the power supply, and the low-side driver unit can be switched on when either signal meets the requirement.

In a second embodiment of the first example, the drive circuit is configured to drive a load, and the load is grounded through the low-side driver module 201; and the low-side driver module 201 includes a first low-side driver unit and a second low-side driver unit, where a first terminal of the first low-side driver unit and a first terminal of the second low-side driver unit are both connected to a second terminal of the load 101, a second terminal of the first low-side driver unit and a second terminal of the second low-side driver unit are grounded, the control module 203 is connected to a control terminal of the first low-side driver unit, and an output terminal of the delay module 202 is connected to a control terminal of the second low-side driver unit. In some embodiments, the control module 203 may be configured to: after detecting a switch-on signal, output the drive signal of the second level or a second pulse width modulation PWM control signal to the first low-side driver unit, output a control signal of the first level or the third level to the first controlled terminal of the delay module 202, and output a control signal of a fifth level or a third pulse width modulation PWM control signal to the second controlled terminal of the delay module 202; and after detecting a switch-off signal, output the drive signal of the fourth level to the first low-side driver unit, and output a control signal of the third level to the first controlled terminal and the second controlled terminal of the delay module 202, where a period of the third pulse width modulation PWM control signal is less than the preset duration; and when the edge signal is a rising edge signal, the fifth level is a low level, or when the edge signal is a falling edge signal, the fifth level is a high level.

In some embodiments, after detecting the switch-on signal, the control module 203 outputs the first level to the first controlled terminal of the delay module 202, to ensure that when the control module 203 is being reset, the delay module 202 outputs a delay signal of the second level when the edge signal is detected at the second controlled terminal, so that the relay maintains an on state.

Figure 5:
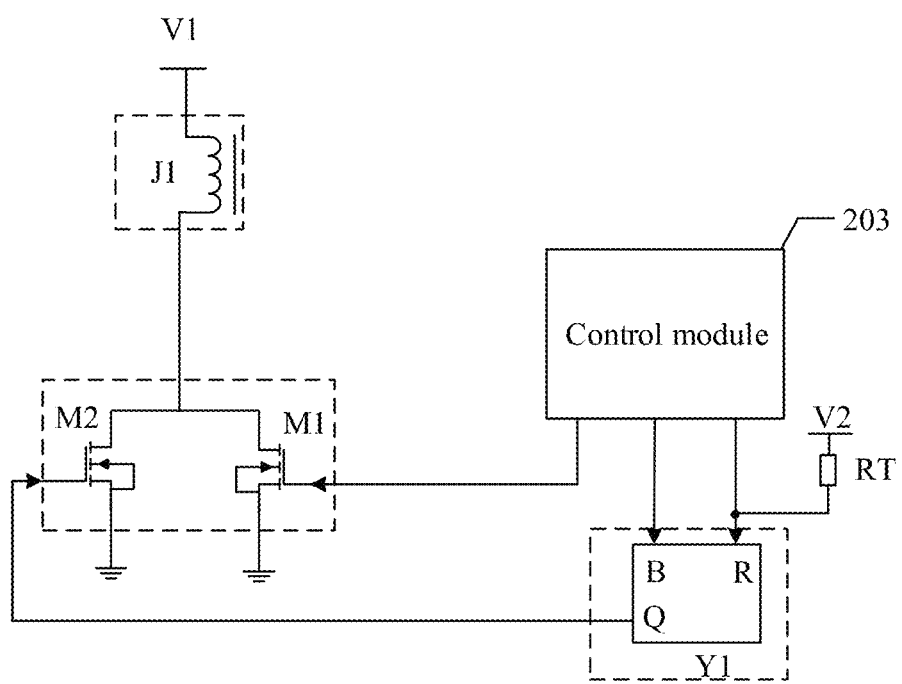

It is assumed that the load 101 is a relay and the first low-side driver unit and the second low-side driver unit are type-N transistors, the first level and the second level are high levels, the third level and the fourth level are low levels, and the edge signal is the falling edge signal. FIG. 5 is a schematic circuit diagram of the drive circuit. V1 represents the drive power supply, J1 represents the relay, M1 represents the first low-side driver unit, M2 represents the second low-side driver unit, Y1 represents the delay component, R represents the first input terminal of the delay component, B represents the second input terminal of the delay component, Q represents the output terminal of the delay component, V2 represents a first signal terminal of the pull-up power supply, and RT represents a first pull-up resistor. The control signal 2 may be a constant-level signal or a pulse width modulation signal.

It is assumed that the control signal 2 is the constant-level signal, and the working principle of the drive circuit is as follows: When receiving a relay switch-on signal, the control module 203 outputs a PWM drive signal (second pulse width modulation PWM drive signal) to the control terminal of the first low-side driver unit, outputs a high-level control signal 1 to the port R of the delay component, and outputs a high-level control signal 2 to the port B of the delay component. Because there is no falling edge, a low level is output at the port Q of the delay component, and the first low-side driver unit is switched on. That is, when the control module 203 works normally and the relay is on, the first low-side driver unit is switched on, and in this case, the second low-side driver unit is switched off. When the control module 203 is being reset, the drive signal of the first low-side driver unit is pulled down, the control signal 2 is pulled down, and the control signal 1 is pulled up. The port Q of the delay component outputs a high-level pulse, so that the second low-side driver unit is switched on. In this case, the first low-side driver unit is switched off, and the relay is not switched off within the set delay time. At the end of the reset (work resumed), the control module 203 sends a PWM drive signal, so that the first low-side driver unit is connected. In some embodiments, the control signal 1 is first pulled down and then pulled up, and the control signal 2 is pulled up, so that the second low-side driver unit is switched off and returns to a normal working state of the low-side driver module 201. When receiving a relay switch-off signal, the control module 203 outputs a low-level drive signal to the control terminal of the first low-side driver unit, outputs a low-level control signal 1 to the port R of the delay component, and outputs a low-level control signal 2 to the port B of the delay component. In this case, the port Q of the delay component outputs a low level, and the relay is off. When the control module 203 is being reset, the drive signal of the first low-side driver unit is continuously at a low level, the control signal 1 is pulled up because of the first pull-up resistor, the control signal 2 is continuously at a low level, output of the port Q of the delay component is continuously at a low level, and the relay maintains an off state and is not accidentally switched on.

It should be noted that a person skilled in the art can understand that, for a PWM-driven relay, the PWM drive signal is output to the first low-side driver unit, and when the control module 203 is being reset, the relay is driven through the high level instead of the PWM. Therefore, when designing the delay time (preset duration) of the delay component, a person skilled in the art may consider whether a coil of the relay can normally work within the preset duration, in order to avoid burn-down of the coil caused by a coil current that is excessively large and lasts for excessively long time when the relay is driven through a high level. Therefore, the preset duration needs to be greater than the reset time of the control module 203, to ensure that when the control module 203 is being reset, the relay maintains a state before the control module 203 is reset; and the preset duration needs to be less than duration of high-level driving that can be tolerated by the relay, to protect the relay. An instruction sequence after the control module 203 completes the reset should also be considered. If delay between an instruction for controlling the first low-side driver unit and an instruction for controlling the second low-side driver unit is very long or even longer than action time of the relay, the first low-side driver unit needs to be first connected, and then the second low-side driver unit is disconnected. If the delay is very short and shorter than the action time of the relay, the sequence is not limited.

It is worth mentioning that in this embodiment, two low-side driver units are disposed. The first low-side driver unit is switched on or off based on the PWM drive signal output by the control module 203, the second low-side driver unit is switched on or off based on the delay signal output by the delay module 202, and therefore, when the control module 203 is being reset, if the relay is switched from PWM control to high-level control, a large current generated by the relay passes through the second low-side driver unit instead of the first low-side driver unit, so that a large current in the circuit does not affect service life of the first low-side driver unit, thereby ensuring safety of a vehicle during normal operation of the control module 203.

In some embodiments, to prevent the large current from affecting service life and performance of the second low-side driver unit, a person skilled in the art can select a chip with a larger operating current as the second low-side driver unit.

In a second example, the delay unit includes N cascaded delay components; and first input terminals of all the delay components are mutually connected, where a joint serves as the first controlled terminal of the delay unit, a second input terminal of a $1^{st}$ delay component is connected to the second controlled terminal of the delay unit, a second input terminal of an $(i+1)^{th}$ delay component is connected to an output terminal of an $i^{th}$ delay component, and an output terminal of an $N^{th}$ delay component serves as the output terminal of the delay unit, where $1 \leq i < N$, and N is an integer greater than 1.

It is worth mentioning that the delay unit is obtained by cascading a plurality of delay components, and total delay time of the delay unit is equal to a sum of delay time of the delay components, thereby prolonging the delay time. In addition, in some embodiments, the delay components can have different delay time resolution. Integrating the delay components with the different delay time resolution can ensure that the delay unit can meet more delay time requirements, thereby improving delay precision. For example, when delay of 5.3 seconds is required, to improve precision, a delay component with resolution of seconds and a delay component with millisecond resolution may be selected.

In a first embodiment of the second example, the low-side driver module 201 includes a first low-side driver unit and a second low-side driver unit, where a first terminal of the first low-side driver unit and a first terminal of the second low-side driver unit are both connected to a second terminal of the load 101, a second terminal of the first low-side driver unit and a second terminal of the second low-side driver unit are grounded, the control module 203 is connected to a control terminal of the first low-side driver unit, and the delay module 202 is connected to a control terminal of the second low-side driver unit. In some embodiments, the control module 203 may be configured to: after detecting a switch-on signal, output the drive signal of the second level or a second pulse width modulation PWM control signal to the first low-side driver unit, output a control signal of the first level or the third level to the first controlled terminal of the delay module 202, and output a control signal of a fifth level or a third pulse width modulation PWM control signal to the second controlled terminal of the delay module 202; and after detecting a switch-off signal, output the drive signal of the fourth level to the first low-side driver unit, and output a control signal of the third level to the first controlled terminal and the second controlled terminal of the delay module 202, where a period of the third pulse width modulation PWM control signal is less than the preset duration; and when the edge signal is a rising edge signal, the fifth level is a low level, or when the edge signal is a falling edge signal, the fifth level is a high level.

Figure 6:
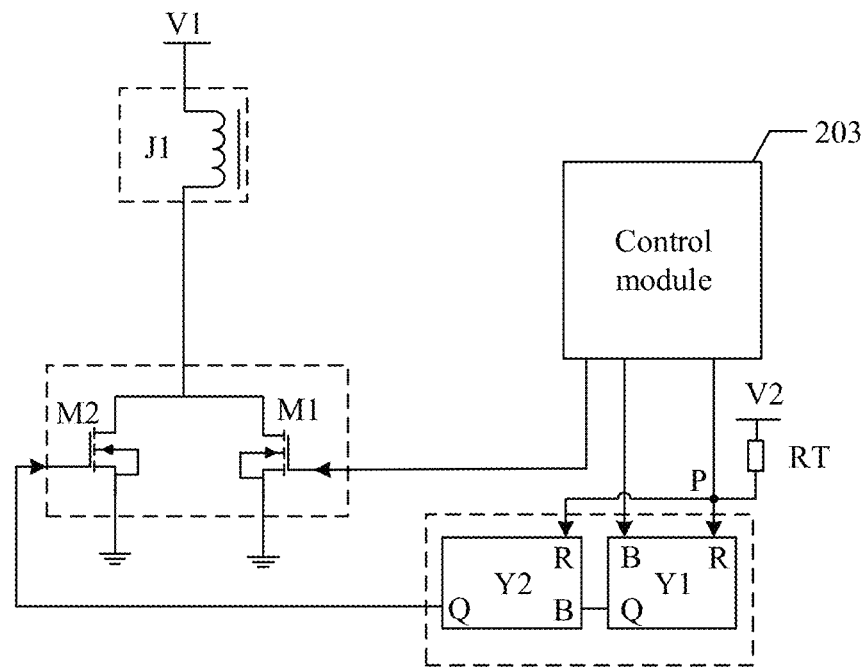

It is assumed that N is equal to 2, the load 101 is a relay and the first low-side driver unit and the second low-side driver unit are type-N transistors, the first level and the second level are high levels, the third level and the fourth level are low levels, and the edge signal is the falling edge signal. FIG. 6 is a schematic circuit diagram of the drive circuit. V1 represents the drive power supply, J1 represents the relay, M1 represents the first low-side driver unit, M2 represents the second low-side driver unit, Y1 represents the first delay component, Y2 represents the second delay component, R represents the first input terminal, B represents the second input terminal, Q represents the output terminal, and P represents the joint (that is, the first controlled terminal) between the first delay component and the second delay component, the terminal B of Y1 is the second controlled terminal, V2 represents a first signal terminal of the pull-up power supply, and RT represents a first pull-up resistor. The control signal 2 may be a constant-level signal or a pulse width modulation signal.

It is assumed that the control signal 2 is the PWM control signal (third pulse width modulation PWM control signal), the working principle of the drive circuit is as follows: When receiving a relay switch-on signal, the control module 203 outputs a PWM drive signal (second pulse width modulation PWM drive signal) to the control terminal of the first low-side driver unit, outputs a high-level control signal 1 to the port R of the first delay component and the port R of the second delay component, and outputs a PWM control signal 2 (third pulse width modulation PWM control signal) to the port B of the first delay component. In this case, a high level is output at the port Q of the first delay component, a low level is output at the port Q of the second delay component, and the first low-side driver unit is switched on. That is, when the control module 203 works normally and the relay is connected, the first low-side driver unit is conductive. When the control module 203 is being reset, a drive signal of the first low-side driver unit is pulled down, and the port Q of the first delay component is switched from a high level to a low level after staying at high level for a period of time, and the time to stay at high level is [T1−t/2, T1). In this case, for a falling edge occurring to the port B of the second delay component, the port Q of the second delay component immediately outputs a high level. During the duration [T1−t/2, T1), the port Q of the second delay component is still at a low level. Because mechanical action time of the relay is on the order of milliseconds, values of T1 and t/2 are appropriately selected, so that the relay is not switched off when the control module 203 outputs a low level. Total delay time of the delay module 202 is a sum of delay time of the first delay component and the second delay component, that is, (T2+T1−t/2, T2+T1). T1 is the delay time of the first delay component, t is a period of the PWM control signal, and T2 is the delay time of the second delay component. After completing the reset, the control module 203 may send a PWM drive signal, so that the first low-side driver unit is connected. In addition, the control signal 1 is first pulled down and then pulled up, and a PWM control signal 2 is output, so that the second low-side driver unit is switched off and returns to a normal working state of the low-side driver module. When receiving a relay switch-off signal, the control module 203 outputs a low-level drive signal to the control terminal of the first low-side driver unit, so that the first low-side driver unit is switched off, and the control module outputs the low-level control signal 1 to the port R of the first delay component and the port R of the second delay component, and outputs the low-level control signal 2 to the port B of the first delay component, the port Q of the first delay component outputs a low level, a low level is output at the port Q of the second delay component, and the second low-side driver unit is switched off. When the control module 203 is being reset, the drive signal of the first low-side driver unit is switched to a low level, the control signal 1 is pulled up because of the first pull-up resistor, the control signal 2 is continuously at a low level, and outputs of both the port Q of the first delay component and the port Q of the second delay component are at a low level. The relay maintains an off state and is not accidentally switched on.

It is worth mentioning that controlling the first low-side driver unit with the PWM drive signal can adjust the on time of the low-side driver module by changing a duty ratio of the PWM drive signal, thereby adjusting a current of the load terminal.

It is worth mentioning that a plurality of delay components form the delay unit, thereby prolonging the delay time.

In some embodiments, the delay component is a monostable flip-flop.

It should be noted that a person skilled in the art can understand that in practical applications, another device may be selected as the delay component. A circuit form of the delay component is not limited in this embodiment.

Figure 7:
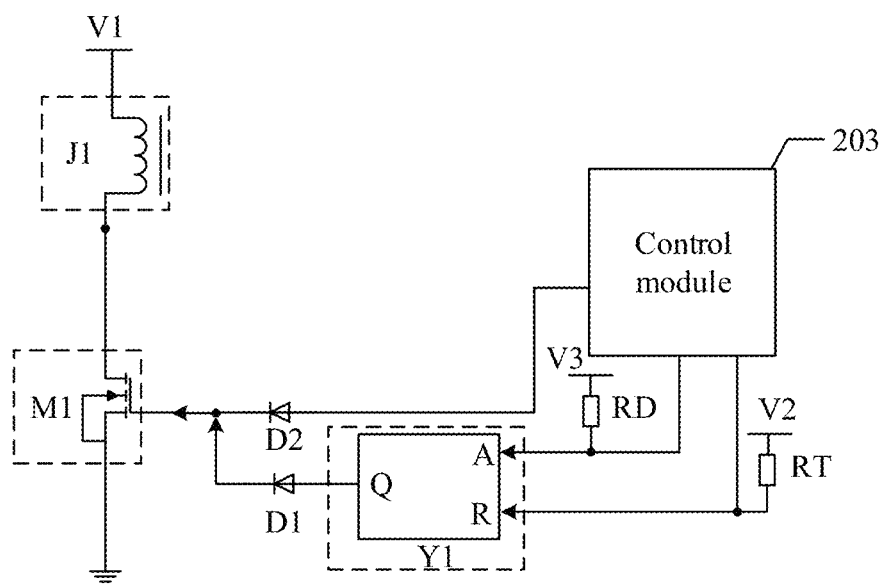
FIG. 7 to FIG. 9 are schematic circuit diagrams of a drive circuit when an edge signal is a rising edge signal according to the second embodiment in the embodiments of this application.
Figure 8:
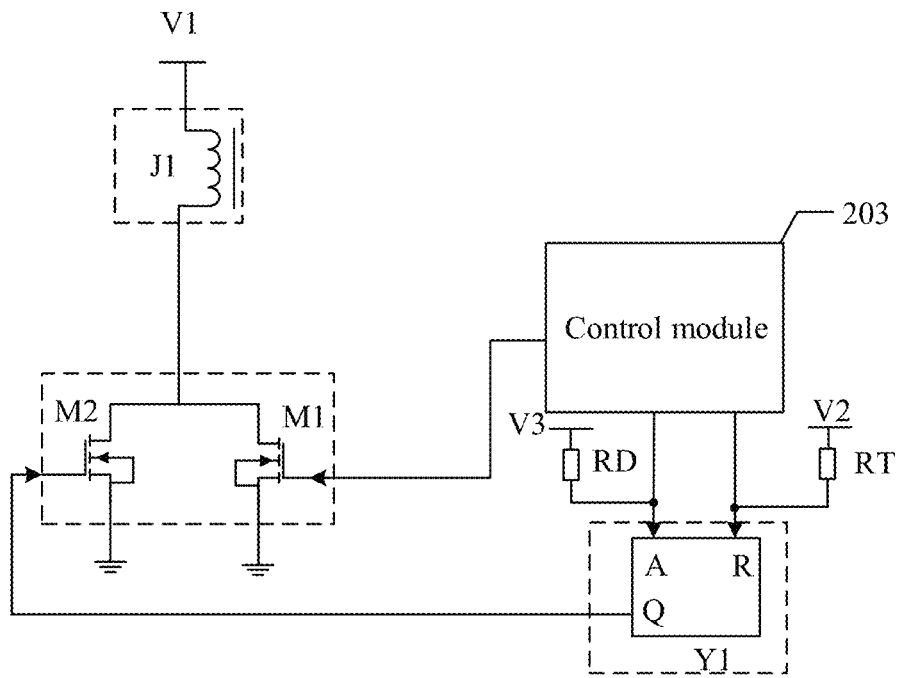
Figure 9:
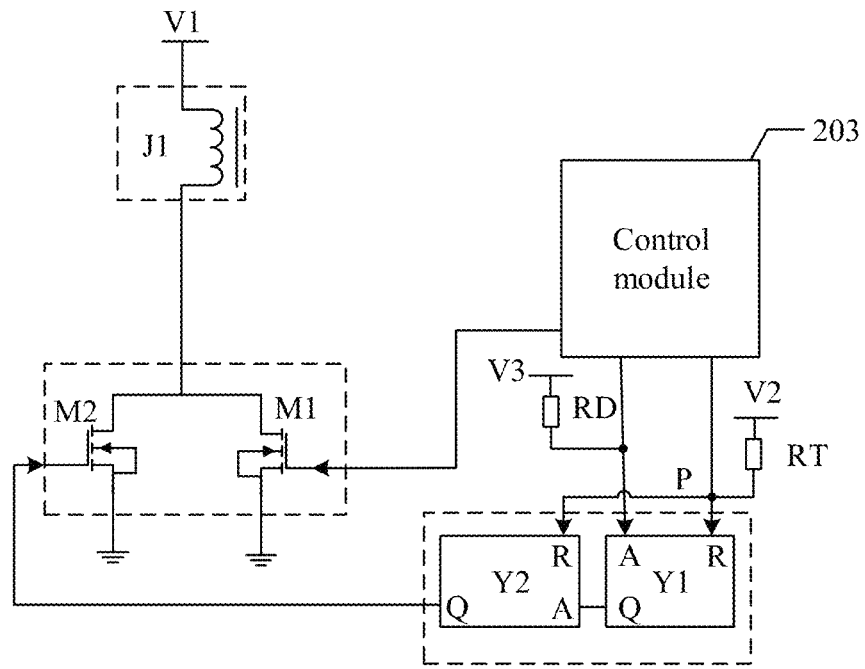

It should be noted that in FIG. 3 to FIG. 6, an example in which an edge signal is a falling edge signal is used to illustrate a circuit structure of a drive circuit. In practical applications, the edge signal may be a rising edge signal. When the edge signal is a rising edge signal, FIG. 7 to FIG. 9 show a circuit structure of a drive circuit. V1 represents the drive power supply, J1 represents the relay, M1 represents the low-side driver unit, Y1 represents the delay component, R represents the first input terminal of the delay component, A represents the second input terminal of the delay component, Q represents the output terminal of the delay component, V2 represents a first signal terminal of the pull-up power supply, RT represents the first pull-up resistor, which constitutes the first pull-up unit, V3 represents a second signal terminal of the pull-up power supply, and RD represents the second pull-up resistor, which constitutes the second pull-up unit. Herein, a working principle of a circuit structure shown in FIG. 7 is briefly described. A working principle in FIG. 8 and FIG. 9 may be implemented with reference to related descriptions of the working principle when the edge signal is the falling edge and the working principle in FIG. 7. In FIG. 7, when the edge signal is a rising edge signal, if the control module 203 receives a relay switch-on signal, the control module 203 outputs a high-level drive signal and a high-level control signal 1, or the control module 203 outputs a low-level control signal 2 or a PWM control signal 2. When the control module 203 is being reset, the port R continuously stays at high level under action of the first pull-up unit; and the port A is changed from a low level to a high level because the output of the control module 203 is in a high-impedance state and there is a second pull-up unit. That is, a rising edge appears. Therefore, a high level is output at the port Q of the delay component. If the control module 203 receives a relay switch-off signal, the control module 203 outputs a low-level drive signal to the control terminal of the low-side driver module 201, outputs a low-level control signal 1 to the port R of the delay component, and outputs a high-level control signal 2 to the port A of the delay component. When the control module 203 is being reset, the port R of the delay component is pulled up, the port A of the delay component stays at high level without a rising edge, and therefore, a low level is output at the port Q of the delay component, and the relay maintains an off state.

It should be noted that the foregoing description is only used as an example for illusion and does not impose any limitation on the technical solutions in the embodiments of this application.

Compared with the prior art, based on the drive circuit of the load provided in this embodiment, when the control module 203 is being reset, the delay module 202 can output a delay signal to the low-side driver module, so that the low-side driver module maintains a state before the control module 203 is reset, thereby avoiding safety hazards caused by a state change of the low-side driver module due to the reset of the control module 203.

A third embodiment in the embodiments of this application relates to a drive circuit. This embodiment is obtained by making a further improvement on the basis of the second embodiment. The specific improvement is as follows: A recheck module is added to the drive circuit. The following uses an example to describe the recheck module. For structures and functions of other modules, refer to the related content in the second embodiment. Details are not described herein again.

Figure 10:
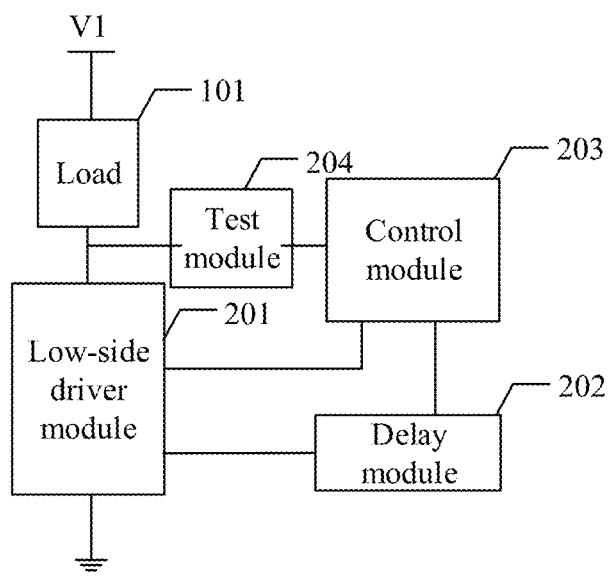
FIG. 10 is a schematic structural diagram of a drive circuit according to a third embodiment in the embodiments of this application.

Specifically, FIG. 10 is a schematic structural diagram of a drive circuit. The drive circuit is configured to drive a load 101, and the load 101 is grounded through a low-side driver module 201. The drive circuit also includes a recheck module 204, an input terminal of the recheck module 204 is connected to a joint between the low-side driver module 201 and the load 101, and an output terminal of the recheck module 204 is connected to the control module 203. The control module 203 is further configured to: at the end of the reset (work resumed), output the drive signal based on a recheck signal input by the recheck module 204 or load state data stored in a storage module, to control the low-side driver module 201.

The following uses an example in which the load 101 is a relay to illustrate a function of the recheck module 204 and a working manner of the control module 203.

In an embodiment, after completing the reset, the control module 203 can determine a drive signal based on a relay state stored in an internal register of the control module 203 (before the reset, the control module can determine a relay state based on the recheck signal input by the recheck module 204). It is assumed that the low-side driver unit is a type-N transistor, if the relay is on, the control module outputs a high-level drive signal, a high-level control signal 1, and a high-level control signal 2, to maintain the on state of the relay; and if the relay is off, the control module outputs a low-level drive signal, a low-level control signal 1, and a low-level control signal 2 to maintain the off state of the relay.

In another embodiment, after completing the reset, the control module 203 determines a current state of the relay based on the recheck signal input by the recheck module 204. If the relay is on, the control module 203 outputs a high-level drive signal, a high-level control signal 1, and a high-level control signal 2, to maintain the on state of the relay; and if the relay is off, the control module 203 outputs a low-level drive signal, a low-level control signal 1, and a low-level control signal 2, to maintain the off state of the relay.

In an embodiment, the recheck module 204 includes a voltage divider sub-module and a filter sub-module, a first terminal of the voltage divider sub-module serves as the input terminal of the recheck module 204, a second terminal of the voltage divider sub-module is connected to a first terminal of the filter sub-module, and a second terminal of the filter sub-module serves as the output terminal of the recheck module 204.

Figure 11:
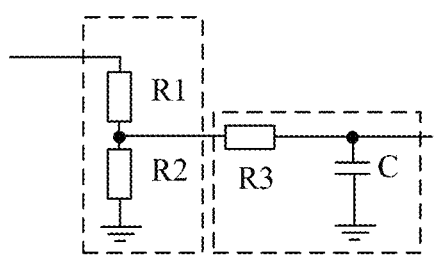
FIG. 11 is a circuit diagram of a recheck module according to the third embodiment in the embodiments of this application.
Figure 12:
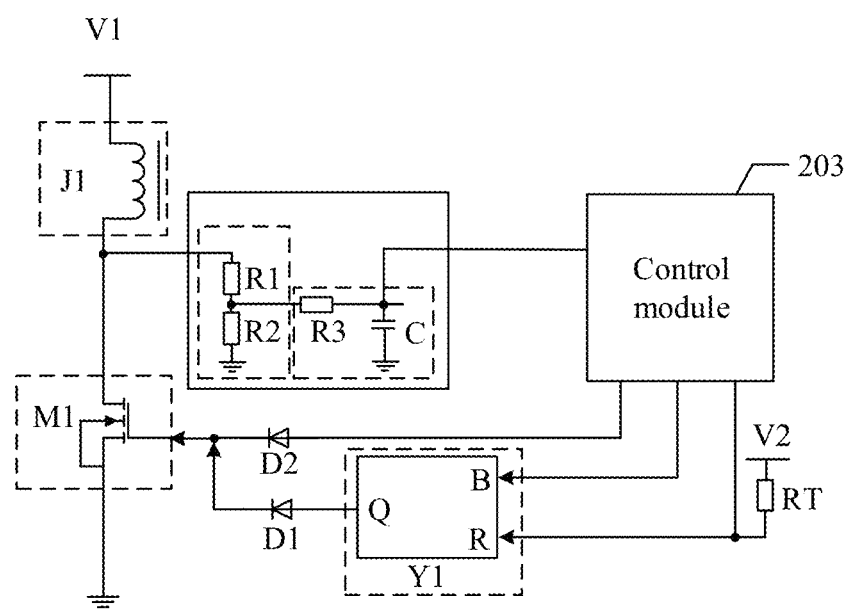
FIG. 12 is a schematic circuit diagram of a drive circuit according to the third embodiment in the embodiments of this application.

In an embodiment, FIG. 11 is a circuit diagram of a recheck module 204. A voltage divider sub-module includes a first voltage divider resistor R1 and a second voltage divider resistor R2. A first terminal of the first voltage divider resistor R1 serves as a first terminal of the voltage divider sub-module, a second terminal of the first voltage divider resistor R1 is connected to a first terminal of the second voltage divider resistor R2, a second terminal of the second voltage divider resistor R2 is grounded, and a node between the second terminal of the first voltage divider resistor R1 and the first terminal of the second voltage divider resistor R2 serves as a second terminal of the voltage divider sub-module. The filter sub-module includes a filter resistor R3 and a filter capacitor C. A first terminal of the filter resistor R3 serves as a first terminal of the filter sub-module. A second terminal of the filter resistor R3 is connected to a first terminal of the filter capacitor C. A second terminal of the filter capacitor C is grounded, and a node between the second terminal of the filter resistor R3 and the first terminal of the filter capacitor C serves as a second terminal of the filter sub-module. FIG. 12 is a schematic circuit diagram of a drive circuit obtained after a recheck module 204 is added to the circuit structure of the delay unit shown in FIG. 4. Meaning of each letter can be understood with reference to FIG. 4 and FIG. 11 in the second embodiment. With reference to the second embodiment 2 and FIGS. 1 to 9, it can be seen that if the load 101 is a relay, when the recheck signal is at a high level, at the end of the reset (work resumed), the control module 203 outputs a high-level drive signal, a high-level control signal 1, and a high-level control signal 2, to control the relay to maintain an on state; and when the recheck signal is at a low level, at the end of the reset (work resumed), the control module 203 outputs a low-level drive signal, a low-level control signal 1 and a control signal 2, to keep the relay off.

It should be noted that a person skilled in the art can understand that in practical applications, the recheck module 204 may alternatively use another detectable circuit form. A circuit structure of the recheck module 204 is not limited in this embodiment.

It should be noted that a person skilled in the art can understand that in FIG. 11 and FIG. 12, an example in which an input terminal of the recheck module 204 is connected to a joint between the low-side driver module 201 and the load 101 is used to illustrate a connection relationship between the recheck module 204 and another module. In practical applications, the input terminal of the recheck module 204 may alternatively be connected to a control terminal of the low-side driver module 201, and the control module 203 determines a level of the drive signal output after the reset based on an electrical signal detected by the recheck module 204.

It should be noted that in FIG. 11 and FIG. 12, an example in which an edge signal is a falling edge signal is used to show a connection relationship among the recheck module 204, the control module 203, the low-side driver module 201, and the delay module 202. In practical applications, when the edge signal is a rising edge signal, a connection relationship among the recheck module 204, the control module 203, the low-side driver module 201, and the delay module 202 is approximately the same as that in a case that the edge signal is the falling edge signal. A person skilled in the art can perform implementation with reference to FIG. 11 and FIG. 12.

It should be noted that a person skilled in the art can understand that in this embodiment, the control module 203 determines a state of the load 101 after the reset based on the recheck signal of the recheck module 204. In practical applications, the control module 203 may alternatively output the drive signal based on load state data stored in a storage module at the end of the reset (work resumed). For example, after receiving a switch-on instruction or a switch-off instruction, the control module 203 writes a relevant instruction into the register. After the reset, the control module 203 reads the data from the register to determine the state of the load 101 after the reset. The control module 203 may alternatively determine the state of the load 101 based on the recheck signal and the load state data stored in the storage module. If the recheck signal or the load state data indicates that the load 101 is off, a signal for keeping the load 101 off is output. A method for the control module 203 to keep the state of the load 101 at the end of the reset (work resumed) is not limited in this embodiment.

It should be noted that the foregoing description is only used as an example for illusion and does not impose any limitation on the technical solutions of this application.

Compared with the prior art, based on the drive circuit of the load provided in this embodiment, when the control module is being reset, the delay module can output a delay signal to the low-side driver module, so that the low-side driver module maintains a state before the control module is reset, thereby avoiding safety hazards caused by a state change of the low-side driver module due to the reset of the control module. When in a working state, the control module can output a drive signal to control the low-side driver module to switch on or off, the drive signal can compete with the output signal of the delay module for power supply, and the low-side driver unit can be switched on when either signal meets the requirement. When the control module is being reset, a delay function of the entire circuit is implemented through a separate delay module, thereby simplifying drive logic of the control module and a circuit design. In addition, there is also a recheck module in the drive circuit, and therefore, the control module can directly output the control signal to the low-side driver module based on the recheck signal at the end of the reset (work resumed), so that the low-side driver module maintains the state before the reset, thereby maintaining the load in the state before the reset is completed.

It is worth mentioning that the modules in the embodiments are all logical modules. In practical applications, a logical unit can be a physical unit or a part of the physical unit, or may be implemented by integrating a plurality of physical units. In addition, to highlight innovation of this application, in the embodiments, units less closely related to resolving of the technical problem mentioned in this application are not introduced, but none of this indicates that there are no other units in the embodiments.

A person of ordinary skill in the art can understand that the foregoing embodiments are specific embodiments for implementing this application, and in practical applications, various changes may be made regarding forms and details of the embodiments without departing from the spirit and scope of this application.

What is claimed is:

1. A drive circuit, wherein the drive circuit comprises a low-side driver module and a delay module;
    the delay module is configured to output a delay signal of preset duration to the low-side driver module in a case that a control module is being reset; and
    the low-side driver module is configured to: according to the delay signal of preset duration, maintain a first state within the preset duration, wherein the first state is the same as a second state;
    wherein the second state is a working state of the low-side driver module before the control module is reset, and the second state comprises being on or off,
    wherein the drive circuit is configured to drive a load, and the load is grounded through the low-side driver module; and
    the low-side driver module comprises a first low-side driver unit and a second low-side driver unit, wherein a first terminal of the first low-side driver unit and a first terminal of the second low-side driver unit are both connected to the load, a second terminal of the first low-side driver unit and a second terminal of the second low-side driver unit are grounded, the control module is connected to a control terminal of the first low-side driver unit, and the delay module is connected to a control terminal of the second low-side driver unit.

2. The drive circuit according to claim 1, wherein the delay module comprises a delay unit and a first pull-up unit; a first controlled terminal of the delay unit is connected to both the first pull-up unit and a first output terminal of the control module, a second controlled terminal of the delay unit is connected to a second output terminal of the control module, and an output terminal of the delay unit is connected to a control terminal of the second low-side driver unit; and
    the delay unit is configured to: when an electrical signal of a first level is detected at the first controlled terminal and an edge signal is detected at the second controlled terminal, output a delay signal of a second level; and when an electrical signal of a third level is detected at the first controlled terminal, output a delay signal of a fourth level;
    wherein the fourth level is a reverse level of the second level, the third level is a reverse level of the first level, and the second low-side driver unit is switched on when receiving an electrical signal of the second level and switched off when receiving an electrical signal of the fourth level.

3. The drive circuit according to claim 2, wherein in a case that the edge signal is a rising edge signal, the delay module further comprises a second pull-up unit, and the second pull-up unit is connected to the second controlled terminal of the delay unit.

4. The drive circuit according to claim 2, wherein the delay unit comprises N cascaded delay components; and
    first input terminals of all the delay components are mutually connected, where a joint serves as the first controlled terminal of the delay unit, a second input terminal of a $1^{st}$ delay component is connected to the second controlled terminal of the delay unit, a second input terminal of an $(i+1)^{th}$ delay component is connected to an output terminal of an $i^{th}$ delay component, and an output terminal of an $N^{th}$ delay component serves as the output terminal of the delay unit, wherein $1 \leq i < N$, and N is an integer greater than 1.

5. The drive circuit according to claim 2, wherein a drive signal comprises a drive signal of the second level and a drive signal of the fourth level; and the control module is configured to: after detecting a switch-on signal, output the drive signal of the second level to the second low-side driver unit, output a control signal of the first level or the third level to the first controlled terminal of the delay module, and output a control signal of a fifth level or a first pulse width modulation PWM control signal to the second controlled terminal of the delay module; and after detecting a switch-off signal, output the drive signal of the fourth level to the low-side driver module, and output a control signal of the third level to the first controlled terminal and the second controlled terminal of the delay module, wherein a period of the first pulse width modulation PWM control signal is less than the preset duration; and when the edge signal is a rising edge signal, the fifth level is a low level, or when the edge signal is a falling edge signal, the fifth level is a high level.

6. The drive circuit according to claim 1, wherein the control module is configured to: after detecting a switch-on signal, output the drive signal of the second level or a second pulse width modulation PWM control signal to the first low-side driver unit, output a control signal of the first level or the third level to the first controlled terminal of the delay module, and output a control signal of a fifth level or a third pulse width modulation PWM control signal to the second controlled terminal of the delay module; and after detecting a switch-off signal, output the drive signal of the fourth level to the first low-side driver unit, and output a control signal of the third level to the first controlled terminal and the second controlled terminal of the delay module, wherein a period of the third pulse width modulation PWM control signal is less than the preset duration; and when the edge signal is a rising edge signal, the fifth level is a low level, or when the edge signal is a falling edge signal, the fifth level is a high level.

7. The drive circuit according to claim 1, wherein the drive circuit further comprises a first anti-reverse module and a second anti-reverse module, the delay module is connected to a control terminal of the second low-side driver unit through the first anti-reverse module, and the control module is connected to the control terminal of the the second low-side driver unit through the second anti-reverse module.

8. The drive circuit according to claim 1, wherein the drive circuit is configured to drive a load, and the load is grounded through the low-side driver module; and the control module is further configured to: at the end of the reset, output a drive signal based on a recheck signal input by a recheck module or load state data stored in a storage module, to control the second low-side driver unit,
wherein an input terminal of the recheck module is connected to a joint between the low-side driver module and the load or connected to the control terminal of the second low-side driver unit, and an output terminal of the recheck module is connected to the control module.

9. The drive circuit according to claim 8, wherein the recheck module comprises a voltage divider sub-module and a filter sub-module, a first terminal of the voltage divider sub-module serves as the input terminal of the recheck module, a second terminal of the voltage divider sub-module is connected to a first terminal of the filter sub-module, and a second terminal of the filter sub-module serves as the output terminal of the recheck module.

10. A processing method for a drive circuit, wherein the drive circuit comprises a low-side driver module and a delay module; and
the processing method comprises:
outputting, by the delay module, a delay signal of preset duration to the low-side driver module in a case that a control module is being reset; and
according to the delay signal of preset duration, maintaining, by the low-side driver module, a first state within the preset duration, wherein the first state is the same as a second state;
wherein the second state is a working state of the low-side driver module before the control module is reset, and the second state comprises being on or off,
wherein the drive circuit is configured to drive a load, and the load is grounded through the low-side driver module; and
the low-side driver module comprises a first low-side driver unit and a second low-side driver unit, wherein a first terminal of the first low-side driver unit and a first terminal of the second low-side driver unit are both connected to the load, a second terminal of the first low-side driver unit and a second terminal of the second low-side driver unit are grounded, the control module is connected to a control terminal of the first low-side driver unit, and the delay module is connected to a control terminal of the second low-side driver unit.

* * * * *